United States Patent [19]
Cardani et al.

[11] Patent Number: 5,003,999
[45] Date of Patent: Apr. 2, 1991

[54] APPARATUS FOR TREATING SILICON WAFERS IN AN ACID BATH

[75] Inventors: Silvestro Cardani, Calusco D'Adda; Flavio Pareschi, Trezzo Sull'Adda, both of Italy

[73] Assignee: SGS Thomson Microelectronics S.R.L., Milan, Italy

[21] Appl. No.: 426,325

[22] Filed: Oct. 24, 1989

[30] Foreign Application Priority Data

Nov. 4, 1988 [IT] Italy ............... 22510 A/88

[51] Int. Cl.$^5$ ............ B08B 3/10; H05B 3/06
[52] U.S. Cl. .................. 134/105; 134/902; 219/523; 392/453
[58] Field of Search ........... 134/105, 902; 219/315, 219/523

[56] References Cited

U.S. PATENT DOCUMENTS

| | | | |
|---|---|---|---|
| 1,222,426 | 4/1917 | Lepper | 219/523 X |
| 1,754,080 | 4/1930 | Briggs et al. | 219/523 X |
| 2,274,445 | 2/1942 | Greer | 219/523 |
| 2,860,226 | 11/1958 | Williams et al. | 219/315 X |
| 3,546,431 | 12/1970 | Gibbs | 219/315 X |
| 3,983,361 | 9/1976 | Wild et al. | 219/523 X |
| 4,408,117 | 10/1983 | Yurkanin | 219/315 X |
| 4,593,178 | 6/1986 | Banta et al. | 219/315 |

FOREIGN PATENT DOCUMENTS 2424941 1/1975 Fed. Rep. of Germany ...... 219/315

Primary Examiner—Philip H. Coe
Attorney, Agent, or Firm—Ladas & Parry

[57] ABSTRACT

An apparatus for treating silicon wafers in an acid bath, comprising at least one advantageously quartz tank (1) for containing an acid in which the wafers are immersed and with which electrical resistors (14) are associated for heating the acid, the tank (1) being positioned during use in a usual process bench or wet hood (3). The tank (1) comprises tubular ducts (5), advantageously of quartz, which are closed at one end (6) and positioned transversely in the tank (1), and which open at (7) into one of its sides (8), the tubular ducts (5) being arranged to removably receive the electrical resistors (14), which are removably connected to the process bench.

19 Claims, 4 Drawing Sheets

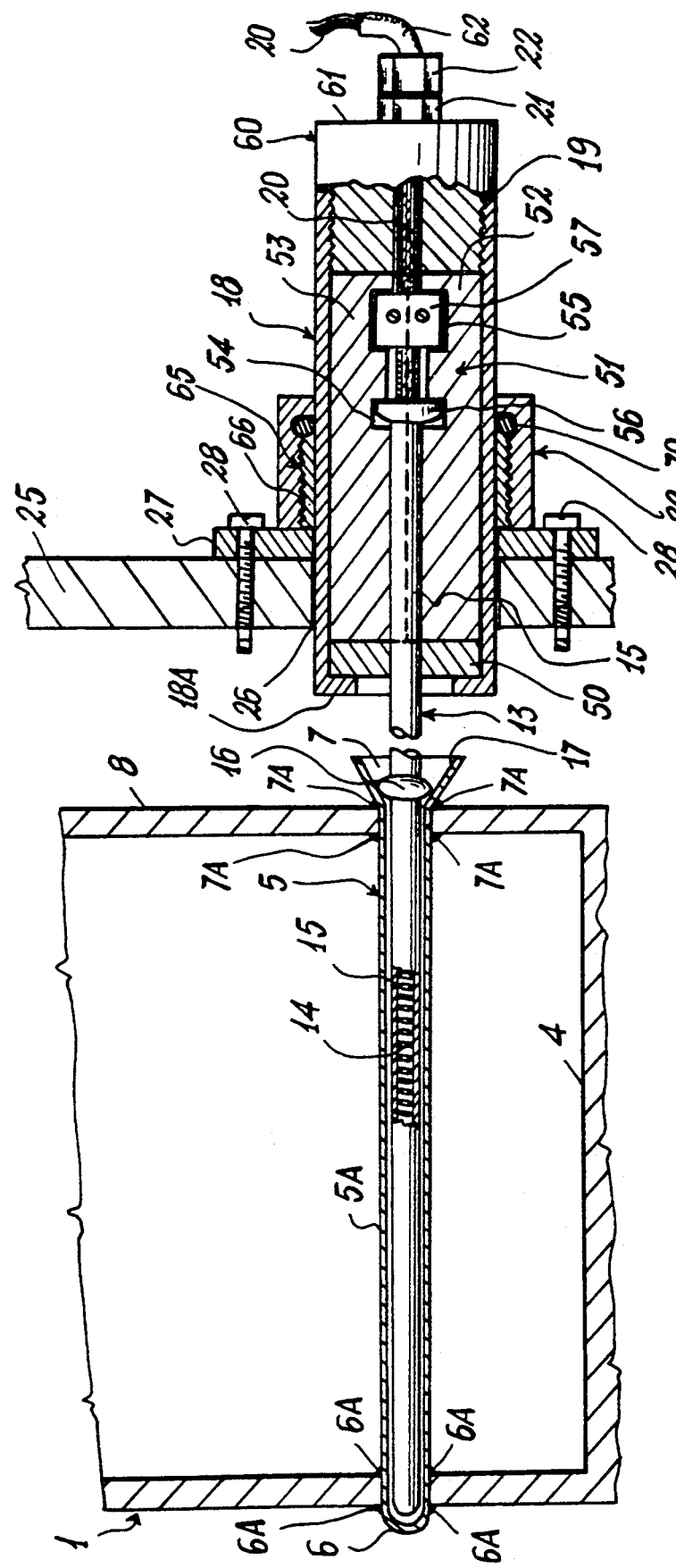

APPARATUS FOR TREATING SILICON WAFERS IN AN ACID BATH

DESCRIPTION

This invention relates to an apparatus for treating silicon wafers in an acid bath, comprising at least one advantageously quartz tank for containing an acid in which the wafers are immersed and with which electrical resistors are associated for heating said acid, said tank being positioned during use in a suitable seat in a process bench or wet hood.

Such an apparatus enables the acid, for example nitric or phosphoric acid, to be raised to a high temperature (in this example, 90° C. and 160° C. respectively). The wafers are then immersed in the hot acid, for example to remove the impurities deposited on them during the various operations to which they have been subjected, and in particular to define on said wafers the electrical tracks previously applied by known methods. An apparatus much used for the aforesaid purposes comprises a quartz tank, on the outside of which, i.e. on the quartz, there are fixed flat electrical resistors. The assembly formed in this manner is enclosed in a further outer tank of plastics material, generally polypropylene, insulation material then being inserted in the interspace between the two tanks. The feed cables for the electrical resistors project from the apparatus formed in this manner.

The thus formed apparatus in inserted into known process benches, also known as wet hoods and generally in the form of large polypropylene tanks to which suction is applied and which contain all the equipment required for the aforesaid purposes. After leaving the hot acid bath the wafers undergo further treatment such as rinsing with deionized water or further attack with cold acid. The wet hood contains all the equipment for such treatment and provides the necessary safety for the operator and facilitates the use of said equipment.

The described construction suffers however from considerable drawbacks. Firstly, inserting an acid-containing tank into an outer propylene tank means that the tank assembly defined in this manner has to be sealed. The seal (generally of silicone resin) is exposed both to the acid vapour and, on occasions, to the acid itself should this overflow from the quartz tank, with obvious resultant inconvenience. In addition the current flowing through the resistors results in the generation of heat which heats the air contained in the interspace between the two tanks, whereas the cooling of this air (when the resistors do not carry current) creates a suction action through the microfissures which inevitably appear particularly in the seals. After a short time this suction action leads to corrosion of the resistors. This means that said resistors have to be replaced, the replacement being done in the workshop after withdrawing the two tanks from the hood. The hood has therefore to be non-operational for long periods because the replacement requires all the acids to be removed, even from other nearby tanks, and the tanks carefully rinsed. The electrical feed cables passing through the hood are also withdrawn because they are integral with the tanks on account of sealing problems.

The same procedure has to be carried out when the resistors need to be replaced not because of corrosion but because they have reached the end of their life, which is not unlimited.

Other apparatus are available commercially for treating wafers in an acid bath using resistors immersed in the acid by insertion into the quartz tank from above so they rest on the base of said tank.

Although this construction solves the resistor replacement difficulty of the aforesaid apparatus, these heater elements are still subject to the problem of acid corrosion, even though it has been sought to remedy this by inserting the resistors into protective sheaths, advantageously of teflon. In any event such a method is complicated because of the need to provide adequate support for the resistors and insulation for the conductors which power them, and it also results in a reduction in the useful area of the tank mouth.

An object of the present invention is to provide an apparatus for treating wafers in an acid bath which obviates the drawbacks of existing apparatus.

A particular object of the present invention is to provide an apparatus of the said type in which the possibility of contact between the acid or acid vapour contained in the quartz tank and present in the wet hood, and the resistors which heat said acid is reduced to a minimum (substantially eliminated).

A further object is to allow simple and safe resistor replacement without the need to empty the tank of acid and to halt the operation of the wet hood, such replacement being always necessary for the aforesaid reasons.

These and further objects which will be apparent to the expert of the art are attained by an apparatus for treating silicon wafers in an acid bath, comprising at least one advantageously quartz tank for containing an acid in which the wafers are immersed and with which electrical resistors are associated for heating said acid, said tank being positioned during use in a usual process bench or wet hood, characterized in that the tank comprises tubular ducts, advantageously of quartz, which are closed at one end and positioned transversely in said tank, and which open into one of its sides, said tubular ducts being arranged to removably receive the electrical resistors, which are removably connected to the process bench.

The present invention will be more apparent from the accompanying drawing, which is given by way of non-limiting example and in which:

FIG. 4 is a section on the line IV—IV of FIG. 3, but with the apparatus in use.

Figure 1:
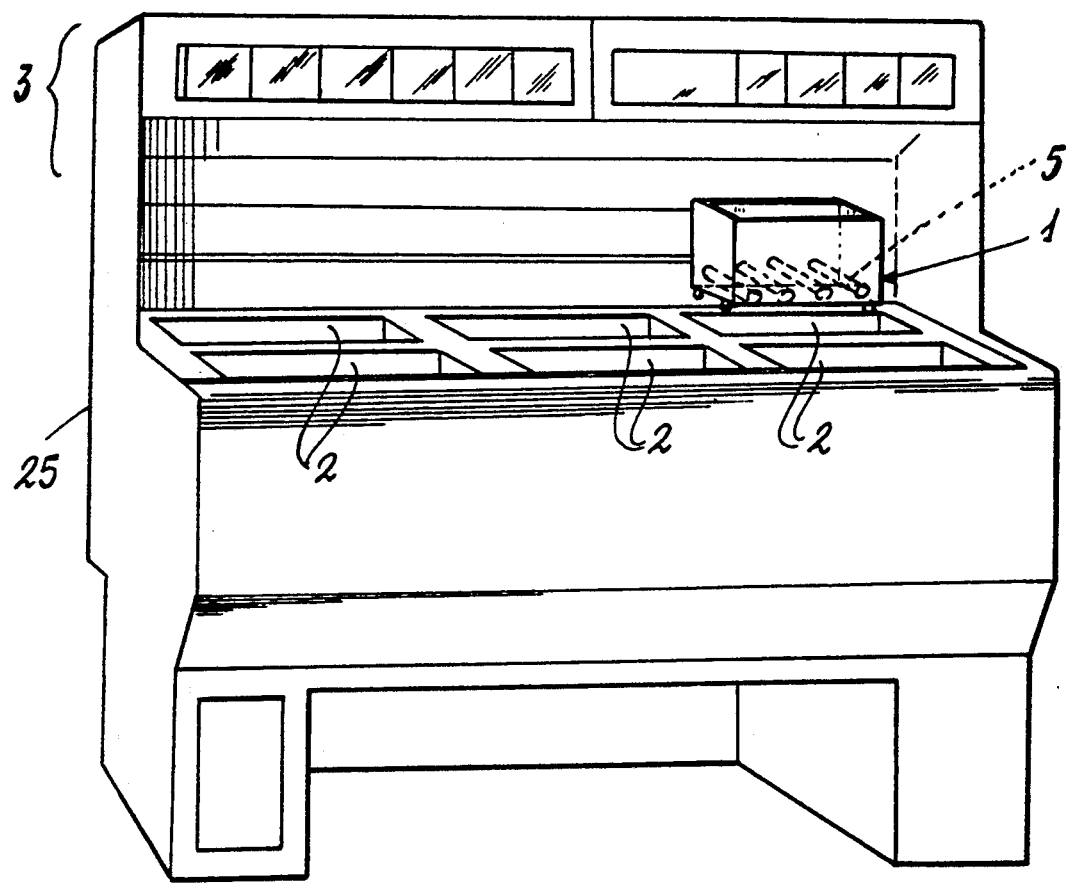
FIG. 1 is a front perspective view of the apparatus according to the present invention, with an acid tank extracted from the process bench.
Figure 2:
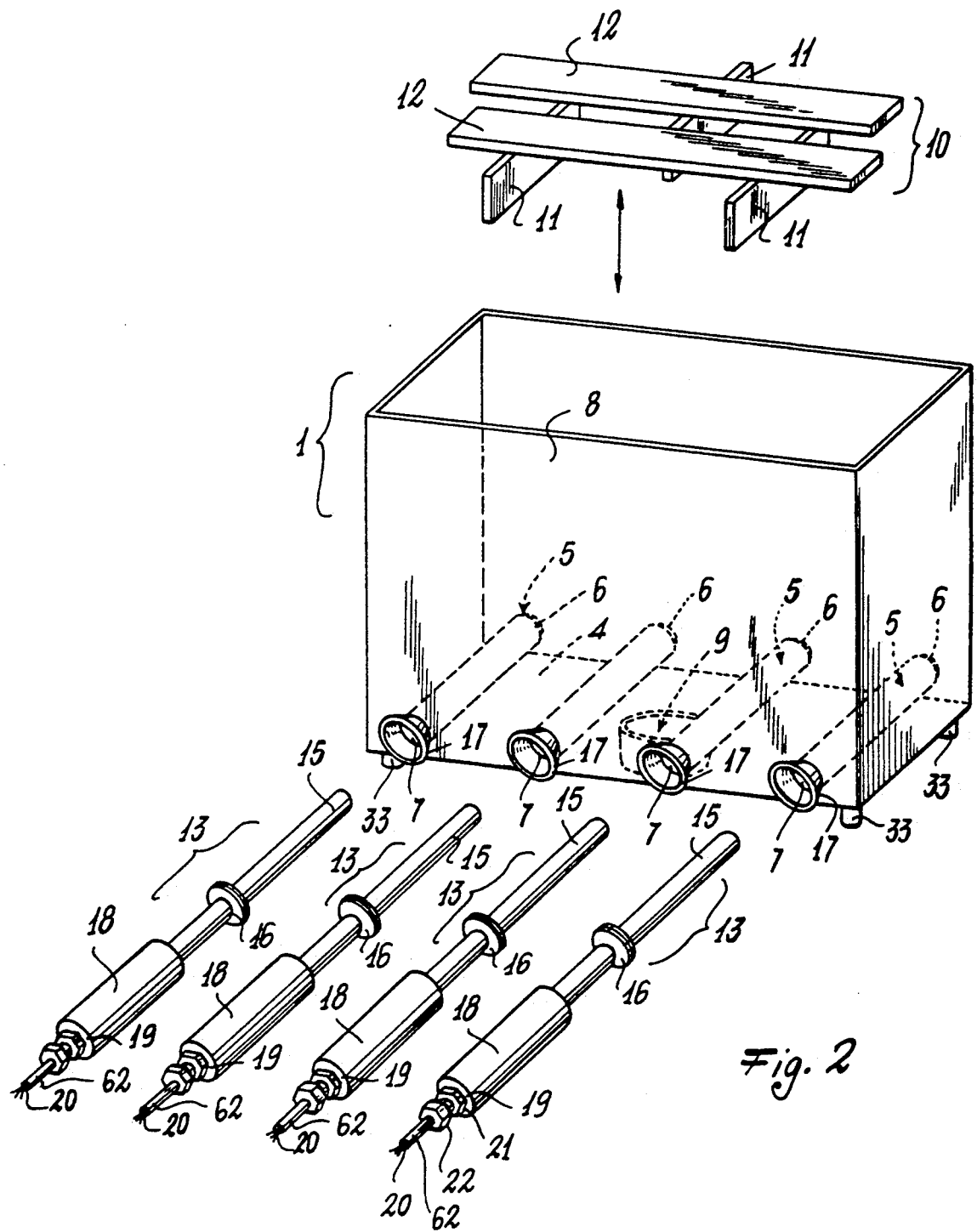
FIG. 2 is a perspective view of a tank of the device according to the invention, with some parts shown in exploded view.
Figure 3:
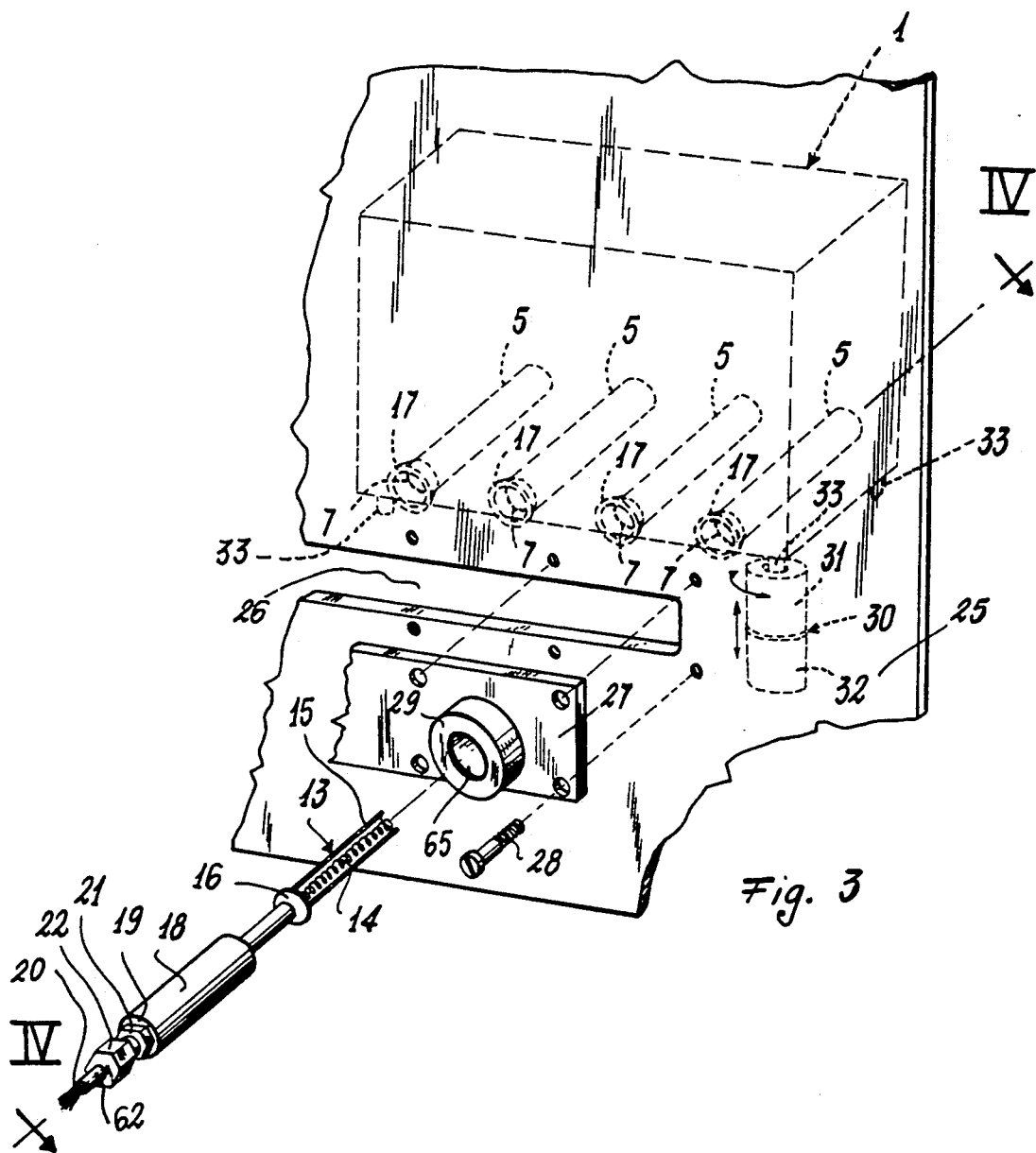
FIG. 3 is a detailed perspective exploded view of a rear part of the process bench of FIG. 1.

With reference to said figures, the apparatus for treating silicon wafers in an acid bath according to the invention comprises a tank 1 advantageously of entirely quartz construction for containing the acid to be heated and in which the wafers are immersed. Said tank 1 is arranged to be inserted into appropriate seats 2 in a known process bench or wet hood 3 which contains all the known equipment required for treating the wafers (not shown).

According to the invention the tank 1, in proximity to its base or bottom 4, comprises tubular ducts 5 (four in number in the example described herein) of quartz construction, which are closed at one end 6 and which open at their other end 7 into one side 8 of said tank 1. Said tubular ducts 5 are of substantially conical shape in proximity to their apertures 7, whereas they are of substantially cylindrical shape in those parts 5A contained within the tank. Specifically, said ducts 5 are positioned transversely within said tank and are secured to the tank 1 for example by welds 6A and 7A made in known manner at said ends 6 and 7 of the ducts 5 (see FIG. 4 in particular) by deposition of quartz weld material.

In the base 4 of said tank 1 a port 9 is provided for discharge of the acid after suitable dilution with water. Said port or discharge port 9 is provided for this purpose with a discharge valve, not shown.

Finally inside the tank 1, resting on its bottom, there is positioned a quartz base structure 10 comprising support elements 11 and cross-members 12 on which the usual baskets (not shown) carrying the wafers to be treated rest.

The choice of quartz as the material of construction of the tank 1 and of all members which come into contact with the acid contained in said tank is due to the fact that this is the only material which can remain in contact with said acid (generally heated to a temperature close to or greater than 100° C.) without undergoing corrosive reaction.

Elements 13 for heating the acid present in the tank 1 are inserted into the tubular ducts 5 through their apertures 7. Said heating elements 13 comprise electrical resistors 14 contained in quartz casings or sheaths 15 which are provided in a substantially intermediate position with a collar 16 to be housed in a lead-in 17 provided around the apertures 7 of the ducts 5 on the side 8 of the tank 1, which is preferably the rear side. Said lead-ins 17 are advantageously of conical shape to facilitate the insertion of the sheaths into the ducts 5. Said lead-ins 17 also prevent any acid which may overflow from the tank entering the ducts 5. For this reason the ducts 5 are closed at their ends 6 to prevent the creation of turbulence which could draw acid vapour, always present under the wet hood 3, into said tubular ducts 5. There is a small clearance between the sheaths 15 and the walls of the duct 5 to prevent these parts adhering together, with corresponding difficulty in extracting the element 13. Such adhesion could occur due to possible contact between acid vapour and the sheaths 15 surrounding the resistors 14, and which because of the high temperature of said sheaths when the resistors 14 are powered could result in partial welding together of the contacting parts (collars 16 to lead-ins 17 and tubular ducts 5 to sheaths 15).

In addition, contact between the acid and/or acid vapour and the hot sheaths 15 always results in partial surface pulverization when these latter cool, so reducing their mechanical strength. As stated, all these problems are obviated by the provision of the lead-ins 17, the collar 16, the closed ends 6 of the ducts 5, and the sheaths 16.

Every quartz sheath 15 is at least partly enclosed by a sheath 18. Starting from that end 18A facing the tank 1, said sleeve 18 contains an annular seal element 50 such as a normal silicon rubber O-ring, and an insert 51 comprising two elements 52 and 53 which close together in the manner of a shell onto the sheath 15, to both act as a further seal for the sheath and to lock it in position.

Specifically, each element or shell 52 and 53 comprises seats 54 and 55 for receiving and retaining the free flared end 56 of the sheath 15 and a normal connector 57 for the electrical feed cables 20 to the resistor 14 present in the sheath 15 concerned. Both the sleeve 18 and the insert 51 are constructed advantageously of polyvinylchloride (PVC) in order to properly resist the acid vapour with which said elements could come into contact.

Finally, the sleeve 15 is closed at that end 19 distant from the said end 18A by a seal member or plug 60 screw-connected to said sleeve and from which said electrical cables 20 emerge. On one end 61, said plug 60 comprises means for engagement between a nut 21 and locking nut 22 which cooperate to clamp the cable. The plug 60 is also of PVC, the cables 20 being advantageously covered with a sheath 62 of teflon or other material suitable for protecting said cables 20 from any contact with acid fumes. The sleeve 18, its contained elements 50, 51, and the plug 60 seal the sheath 15 and prevent any seepage into it of the acid vapour which develops within the hood 3 during the treatment of the wafers. Such vapour, which is also prevented from seeping into the sheaths 18 by the usual suction present under the hood 3, could in fact corrode the resistor 14 of the heating element 13, with obvious consequences.

The particular construction of the tank 1 and heating elements 13 means that these latter can be extracted from the tank when said elements 13 need to be replaced, without having to empty the tank of the acid.

To allow this extraction without having to remove the tank 1 from the wet hood 3 or empty it of its contained acid, there is provided in the rear wall 25, in correspondence with the apertures 7 of the tubular ducts 5 of the tank 1, one or more apertures 26, for example in the form of a long slot embracing all said apertures 7. In this manner the heating elements 13 can be inserted into the tank 1 from the outside of the hood 3 without having to extract the tank from its seat 2 in said hood. In this respect, on the aperture 26 there is superposed a panel 27 secured to the wall 25 of the hood 3 for example by screws 28. The panel 27 supports substantially cylindrical elements 65 which are threaded on their outer surface at 66 and are provided with a through bore, said elements 65 corresponding in position with the apertures 7 of the tubular ducts 5 when the panel 27 has been mounted on the wall 25 of the hood 3. Each of said elements 65 is arranged to cooperate with a ring nut 29 which locks the heating elements 13 in position. Each of said ring nuts 29 cooperates with a sleeve 18 by way of a seal ring 70, such as an O-ring. Said ring 70 performs the double function of both sealing said sleeve against acid vapour and clamping it. In this respect, by screwing the ring nut 29 onto the respective element 65 of the panel 27, the ring 70 is pressed against the sleeve 18, so performing said clamping function for this latter.

It should be noted that centering between the apertures 7 in the side 8 of the tank 1 and the aperture or apertures 26 in the rear wall 25 of the hood 3 is obtained by a device 30 for height-adjusting the position of the tank 1, and comprising cylinders 31 and 32, advantageously of teflon, which cooperate with each other by screwing and support the resting feet 33 with which the tank 1 is provided.

Specifically, the upper cylinder 31 of the device 30 comprises in its free face an eccentric hole (not visible in the figures) in which the resting foot 32 of the tank 1 is positioned. This eccentricity enables the manufacturing tolerances of the quartz tank 1 arising during the formation of said feet to be compensated.

The described system enables a heating element 13 to be replaced when the resistor 14, which has a finite life, undergoes damage. This replacement is carried out by disconnecting the sleeve 18 of the element 13 to be replaced from the panel 27 by disengaging the ring nut 29 from the element 65 of said panel and extracting said heating element or rather the quartz sheath 15 from the tubular cavity 5 in the tank 1 by withdrawal through the rear of the hood 3.

Having done this the element 13 is replaced by another in perfect condition, without the need for access to the tank and therefore without having to empty it of acid.

The present invention therefore allows simple replacement of the damaged heating element without having to halt the operation of the wet hood, without having to remove the quartz tank from it and without having to empty this latter of acid. Such replacement is simple and requires only a short time for completion.

A further advantage of the invention is the absence of any corrosive action not only against the resistors but also against the electrical connections required for their operation, with the result that these elements have a consequently greater life.

In this respect, the resistors are enclosed in quartz sheaths and the electrical connectors for the feed to the resistors are contained in the sleeves which for most of their length are outside the hood. Because of the seals provided by the elements present in each sleeve, neither the acid vapour nor any acid splashes can reach the interior of the sleeve, to damage the electrical contacts present in it and penetrate into the sheath containing the heating element. This is further aided by the fact that the acid vapour is drawn into the hood and conveyed through slots provided for this purpose.

We claim:

1. An apparatus for treating silicon wafers in an acid bath comprising:
    at least one quartz tank having sides and a substantially flat bottom for containing an acid in which silicon wafers are immersed, said tank comprising a plurality of tubular ducts integral with said tank, made of quartz, each said tubular duct being closed at a first end and open at a second end, and horizontally and fixably disposed with its first and second ends being fluid tight in two opposite sides of said tank, such that said tubular ducts are positioned traversing the interior of said tank;
    electrical resistance heating members removably received within said tubular ducts, for heating the acid; and
    a process bench to which said electrical resistance heater member are removably connected, said tank being positioned in said process bench during use.

2. The apparatus for treating silicon wafers as recited in claim 1, further comprising:
    apertures defined in said process bench, said apertures being opposite said open second end of said tubular ducts; and
    at least one support plate, said electrical resistance heating members being secured to said support plate, said support plate being secured to said process bench such that said electrical resistance heating members pass through said apertures and insert into said tubular ducts.

3. The apparatus as claimed in claim 2 wherein said tubular ducts are fluid tightly welded to said quartz tanks.

4. The apparatus as claimed in claim 3 wherein said tubular ducts are of cylindrical shape in the portion present inside the quartz tank, and wherein said tubular ducts have a conical shaped portion near said second open end which extends outside said quartz tank.

5. The apparatus as claimed in claim 4, wherein each electrical resistance heating member comprises:
    an electrical resistor;
    a casing enclosing said resistor, said casing terminating in a sleeve, said portion of electrical resistance heating member terminating in a sleeve being positioned outside said quartz tank, and electric cables for electrically feeding said electrical resistor emerging from an end of said sleeve distant said quartz tank.

6. The apparatus as claimed in claim 5, wherein said casing is constructed of quartz.

7. The apparatus as claimed in claim 5, wherein said electric feed cables and said resistors electrically connect inside said sleeve.

8. The apparatus as claimed in claim 5, wherein each said electrical resistance heating member further comprises a collar positioned on the outside of said casing substantially intermediate between the ends of said electrical resistance heating member, said collar abutting the inside surface of said conical shaped portion when said electrical resistance heating member is inserted into said tubular ducts.

9. The apparatus as claimed in claim 5, further comprising:
    a substantially cylindrical element carried on said support plate, extending away from said quartz tank, said substantially cylindrical element having a bore defined therethrough and a threaded outer surface; and
    a ring nut, threadable on said cylindrical element, said ring nut cooperating with said sleeve in order to secure said electrical resistance heating member to said process bench.

10. The apparatus as claimed in claim 5, wherein said sleeve comprises:
    at least one annular seal element, said annular seal element being fluid tightly positioned on end of said sleeve nearest said quartz tank;
    an insert which acts as a seal for, and locks in position, said casing of said electrical heater member with which said sleeve is associated; and
    a closure member fluid tightly positioned on end of sleeve distant from said quartz tank.

11. The apparatus as claimed in claim 10, wherein said sleeve, said insert and said closure member are constructed of polyvinylchloride.

12. The apparatus as claimed in claim 11, wherein said annular seal element is an O-ring made of silicone rubber.

13. The apparatus as claimed in claim 2, wherein said apertures in said process bench are provided in a rear wall of said process bench.

14. The apparatus as claimed in claim 13, wherein said apertures in said process bench are in the form of an elongated slot provided transversely along an entire rear wall of said process bench.

15. The apparatus as claimed in claim 11, further comprising at least one device for adjusting the height of said quartz tanks within said process bench, said devices comprising an upper and a lower superposed cylinder which screw-cooperate with each other and which support said quartz tank on resting feed provided on the bottom of said quartz tank.

16. The apparatus as claimed in claim 15, wherein defined on the upper surface of said upper cylinder is an eccentric hole arranged to receive one each of the resting feet of said quartz tank.

17. An apparatus for treating silicone wafers in an acid bath comprising:

at least one tank having sides and a bottom for containing an acid in which silicone wafers are immersed, said tank comprising a plurality of tubular ducts, each said tubular duct being closed at a first end and open at a second end, and horizontally and fixably disposed transversely of the interior of said tank with said open end accessible through one side of said tank;

a process bench within which said tank is positioned during use of said tank, including means defining a plurality of apertures, each of said apertures axially aligned with a corresponding one of said plurality of tubular ducts; and a plurality of electrical resistance heating members, each being removably received within a corresponding one of said plurality of tubular ducts after passing through a corresponding aperture in said bench, for permitting direct removal of said electrical resistance heating members from both said tank and bench.

18. The apparatus for treating silicon members as recited in claim 17, further comprising an adjusting means for aligning the position of said tank such that said apertures in said bench are axially aligned with said tubular ducts.

19. The apparatus as claimed in claim 18, wherein said adjusting means includes an upper and a lower superimposed cylinder which screw-cooperate with each other and which support said tank on resting feet provided on the bottom of said tank for adjusting the height of said tank within said process bench.

* * * * *